(12) United States Patent
Tu

(10) Patent No.: US 11,177,011 B2
(45) Date of Patent: Nov. 16, 2021

(54) BIT DATA SHIFTER

(71) Applicant: Winbond Electronics Corp., Taichung (TW)

(72) Inventor: Ying-Te Tu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 283 days.

(21) Appl. No.: 16/449,349

(22) Filed: Jun. 22, 2019

(65) Prior Publication Data

US 2020/0402600 A1 Dec. 24, 2020

(51) Int. Cl.
*G11C 19/28* (2006.01)
*H03K 3/037* (2006.01)

(52) U.S. Cl.
CPC ............ *G11C 19/28* (2013.01); *G11C 19/287* (2013.01); *H03K 3/0372* (2013.01)

(58) Field of Classification Search
CPC .... H03K 3/0372; H03K 3/3562; G11C 19/28; G11C 19/287
See application file for complete search history.

(56) References Cited

U.S. PATENT DOCUMENTS

| | | | |
|---|---|---|---|
| 6,058,156 A * | 5/2000 | Kanba | G11C 19/28 377/78 |
| 6,108,394 A * | 8/2000 | Dilbeck | G11C 19/287 377/67 |
| 6,847,241 B1 | 1/2005 | Nguyen et al. | |
| 8,000,432 B2 * | 8/2011 | Iwai | G11C 19/28 377/76 |
| 9,437,323 B2 * | 9/2016 | Lim | G11C 19/00 |
| 9,627,012 B1 * | 4/2017 | Huott | G11C 19/28 |
| 10,243,545 B2 * | 3/2019 | Goh | H03K 5/1515 |
| 2005/0031068 A1 | 2/2005 | Chan et al. | |

FOREIGN PATENT DOCUMENTS

| | | |
|---|---|---|
| CN | 1758381 | 4/2006 |
| TW | 200405332 | 4/2004 |
| TW | 200610268 | 3/2006 |

OTHER PUBLICATIONS

"Office Action of Taiwan Counterpart Application", dated Apr. 20, 2020, p. 1-p. 5.

* cited by examiner

*Primary Examiner* — Patrick O Neill
(74) *Attorney, Agent, or Firm* — JCIPRNET

(57) ABSTRACT

A bit data shifter receives an input signal and a plurality of clock signals. The bit data shifter includes a plurality of data shifter groups cascaded in sequence, and each of the plurality of data shifter groups cascaded in sequence includes a plurality of data latches cascaded in sequence and a master-slave flip-flop. The plurality of data latches cascaded in sequence is configured to delay the input signal in sequence based on the plurality of clock signals to generate a plurality of delayed signals. The master-slave flip-flop is configured to delay one of the plurality of delayed signals based on one of the plurality of clock signals to generate an input signal of a next data shifter group.

10 Claims, 4 Drawing Sheets

BIT DATA SHIFTER

BACKGROUND OF THE INVENTION

1. Field of the Invention

The invention relates to a semiconductor device, and particularly relates to a bit data shifter shifting bit data by using a flip-flop.

2. Description of Related Art

Bit data shifters are broadly used in digital circuits, such as counters, timers, and bit accumulators. The basic framework of a conventional bit data shifter is constituted of master-slave flip-flops. Each of the master-slave flip-flops is usually constituted of a two-stage latch and may transmit a single-bit data from the previous stage to the next stage according to a H/L cycle of a clock signal.

In order to reduce the layout area, the circuit and the device size of the master-slave flip-flop is adjusted in the conventional art to reduce the overall area of the bit data shifter. However, no matter how the area of the master-slave flip-flop is reduced, the main structure of the bit data shifter is still constituted of the master-slave flip-flops, and the area that is reduced is rather limited.

SUMMARY OF THE INVENTION

Accordingly, the invention provides a bit data shifter which forms a data shifter group by combining a single-stage latch and a master-slave flip-flop, so as to reduce a layout area of the bit data shifter.

An embodiment of the invention provides a bit data shifter. The bit data shifter receives an input signal and a plurality of clock signals. The bit data shifter includes a plurality of data shifter groups cascaded in sequence, and each of the data shifter groups cascaded in sequence includes a plurality of data latches cascaded in sequence and a master-slave flip-flop. The data latches cascaded in sequence are configured to delay the input signal in sequence based on the clock signals to generate a plurality of delayed signals. The master-slave flip-flop is coupled to the data latches cascaded in sequence, and is configured to delay one of the delayed signals based on one of the clock signals to generate an input signal of a next data shifter group.

Based on the above, the embodiments of the invention provide a bit data shifter. The bit data shifter includes the data shifter groups cascaded in sequence. The data shifter group is constituted of the data latches cascaded in sequence and the master-slave flip-flop. The data latches cascaded in sequence delay the input signal in sequence to generate the delayed signals. The master-slave flip-flop delays one of the delayed signals to generate the input signal of the next data shifter group. According to the framework above, the layout area of the bit data shifter may be reduced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
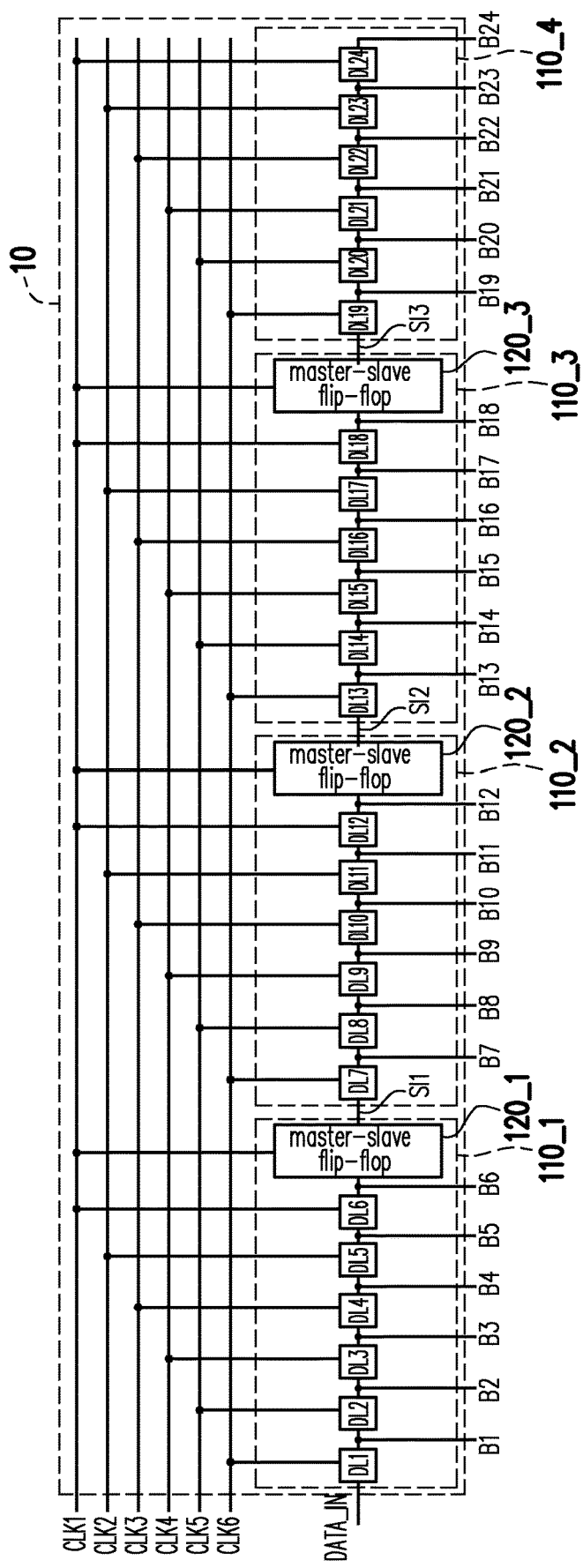
FIG. 1 is a schematic view of a bit data shifter according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, a bit data shifter 10 receives an input signal DATA_IN and a plurality of clock signals CLK1 to CLK6. The bit data shifter 10 includes data shifter groups 110_1, 110_2, 110_3, and 110_4 cascaded in sequence. In an embodiment, the data shifter group 110_1 receives the input signal DATA_IN to generate delayed signals B1 to B6 and provides an input signal SI1 to the data shifter group 110_2. The data shifter group 110_2 receives the input signal SI1 to generate delayed signals B7 to B12 and provides an input signal SI2 to the data shifter group 110_3. The data shifter group 110_3 receives the input signal SI2 to generate delayed signals B13 to B18 and provides an input signal SI3 to the data shifter group 110_4. The data shifter group 110_4 receives the input signal SI3 to generate delayed signals B19 to B24. It should be noted that the number of data shifter groups and the number of delayed signals output by each of the data shifter groups may be determined based on the requirements. The invention does not intend to impose a limitation on this regard.

Figure 2:
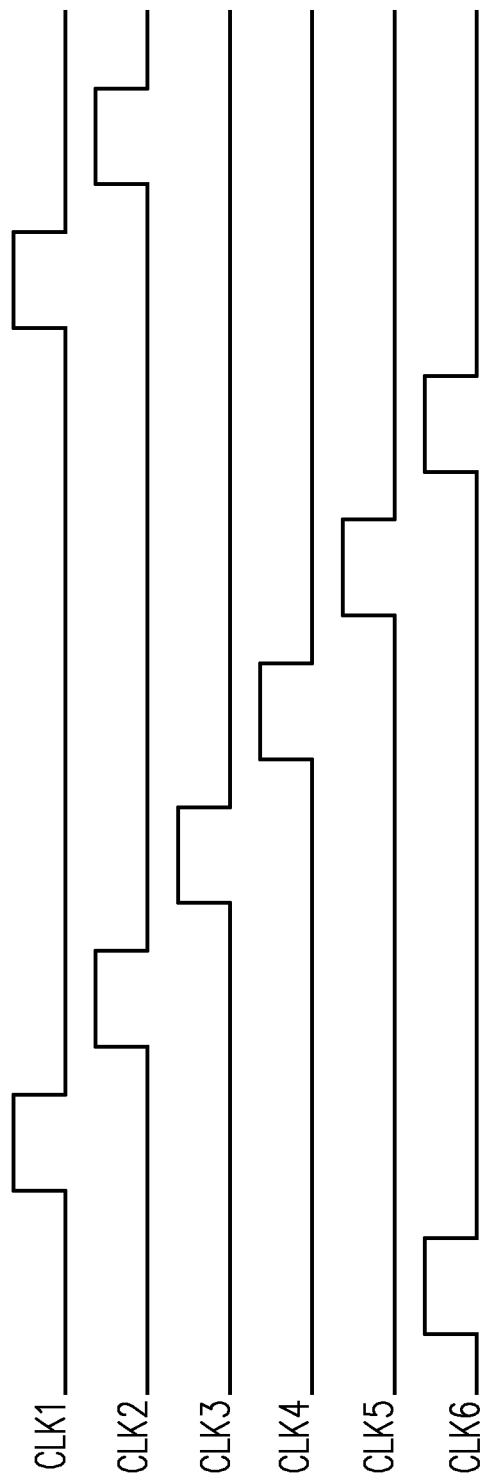
FIG. 2 is a timing diagram of a plurality of clock signals according to an embodiment of the invention.

Referring to FIG. 2, regarding the timing of the clock signals CLK1 to CLK6, the clock signal CLK6 lead only in the case of the initial pulse, and afterwards the phases of the clock signals CLK1 to CLK6 are delayed sequentially. Except for the case of the initial pulse, the clock signal CLK1 has the most leading phase, while the clock signal CLK has the most lagged phase. Referring to FIG. 1, the data shifter groups 110_1 to 110_4 share the clock signals CLK1 to CLK6.

Referring to FIGS. 1 and 2, the data shifter group 110_1 includes data latches DL1 to DL6 cascaded in sequence and a master-slave flip-flop 120_1. The master-slave flip-flop 120_1 is, for example, a master-slave D-type flip-flop. The data latches DL1 to DL6 cascaded in sequence are configured to delay the input signal DATA_IN in sequence based on the clock signals CLK1 to CLK6, so as to generate the delayed signals B1 to B6. Specifically, the data latch DL1 delays the input signal DATA_IN based on the clock signal CLK6, so as to generate the delayed signal B1. The data latch DL2 delays the delayed signal B1 based on the clock signal CLK5, so as to generate the delayed signal B2. The operations of the data latches DL3 to DL6 may be inferred based on the same principle and therefore will not be reiterated in the following. The master-slave flip-flop 120_1 is coupled to the data latches DL1-DL6 cascaded in sequence. In an embodiment, the master-slave flip-flop 120_1 is configured to delay the delayed signal B6 having the most lagged phase among the delayed signals B1 to B6 based on the clock signal CLK1 having the most leading phase, except for the case of the initial pulse, among the clock signals CLK1 to CLK6, so as to generate the input signal SI of the next data shifter group 110_2.

The operations of the data shifter groups 110_2, 110_3, and 110_4 may be inferred based on the same principle and therefore will not be reiterated in the following.

It should be noted that the last one of the data shifter groups 110_1 to 110_4, namely the data shifter group 110_4, includes only the data latches DL19 to DL24 and does not include the master-slave flip-flop.

Figure 3:
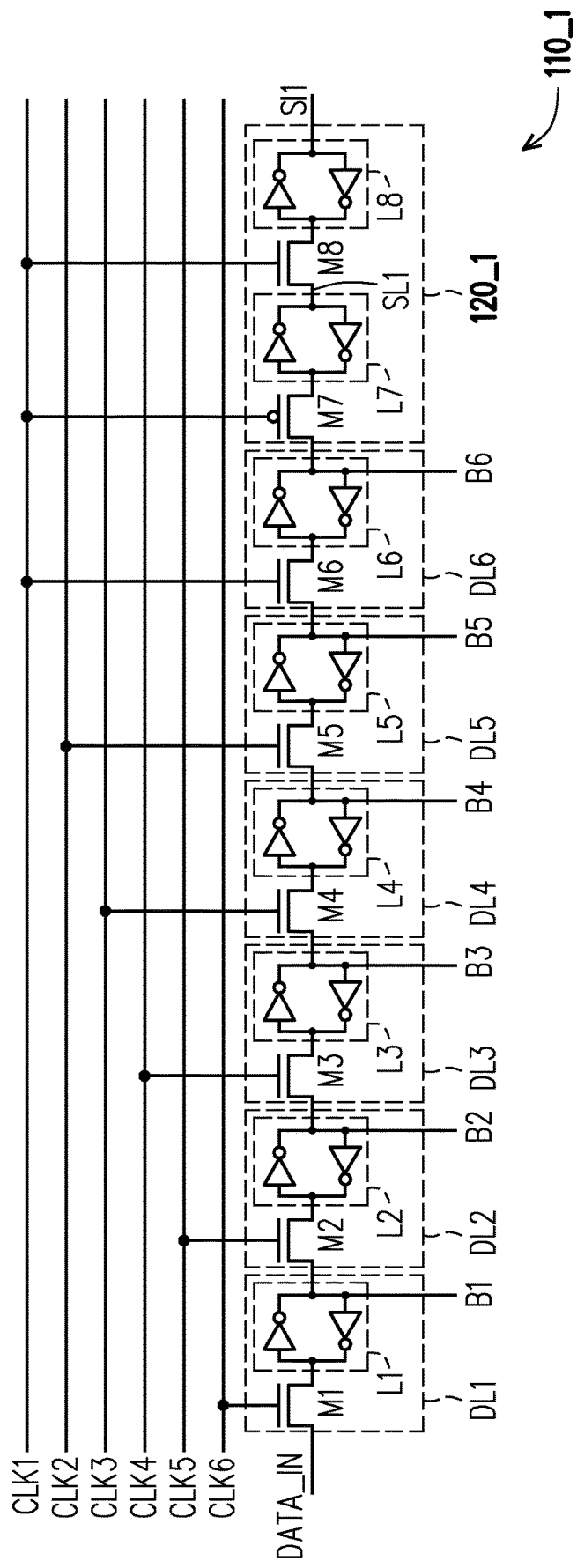
FIG. 3 is a schematic circuit diagram of data shifter groups according to an embodiment of the invention.

FIG. 3 is a schematic circuit diagram illustrating data shifter groups according to an embodiment of the invention. Referring to FIGS. 1 to 3, taking the data shifter group 110_1 as an example, the data shifter group 110_1 includes the data latches DL1 to DL6 cascaded in sequence and the master-slave flip-flop 120_1. Detailed descriptions are as follows.

The data latch DL1 includes a transistor M1 and a latch L1, and the transistor M1 is an N-type metal-oxide-semiconductor (NMOS) transistor. The first end of the transistor M1 receives the input signal DATA_IN, and the second end of the transistor M1 receives the clock signal CLK6. The first end of the latch L1 is coupled to the third end of the transistor M1. The latch L1 includes two inverters. The input end of one of the inverters is coupled to the output end of the other inverter, and the output end of one of the inverters is coupled to the input end of the other inverter. When the clock signal CLK6 is at a logic high level and turns on the transistor M1, the latch L1 receives the input signal DATA_IN and inverts the input signal DATA_IN to generate the delayed signal B1.

The data latch DL2 includes a transistor M2 and a latch L2, and the transistor M2 is an N-type metal-oxide-semiconductor (NMOS) transistor. The first end of the transistor M2 receives the delayed signal B1, and the second end of the transistor M2 receives the clock signal CLK5. The first end of the latch L2 is coupled to the third end of the transistor M2. The latch L2 includes two inverters. The input end of one of the inverters is coupled to the output end of the other inverter, and the output end of one of the inverters is coupled to the input end of the other inverter. When the clock signal CLK5 is at a logic high level and turns on the transistor M2, the latch L2 receives the delayed signal B1 and inverts the delayed signal B1 to generate the delayed signal B2. The operations of the data latches DL3 to DL6 may be inferred based on the same principle and therefore will not be reiterated in the following.

The master-slave flip-flop 120_1 includes a transistor M7, a latch L7, a transistor M8, and a latch L8. The transistor M7 is a P-type metal-oxide-semiconductor (PMOS) transistor. The first end of the transistor M7 is coupled to the data latch DL6 and receives the delayed signal B6. In addition, the delayed signal B6 has the most lagged phase among the delayed signals B1 to B6. The second end of the transistor M7 receives the clock signal CLK1. The transistor M7 is turned on or turned off according to the clock signal CLK1. In addition, the clock signal CLK1 has the most leading phase, except for the case of the initial pulse, among the clock signals CLK1 to CLK6. The latch L7 is coupled to the third end of the transistor M7. When the transistor M7 is turned on, the latch L7 receives the delayed signal B6 and inverts the delayed signal B6 to generate the latch signal SL1. The transistor M8 is an NMOS transistor. The first end of the transistor M8 is coupled to the latch L7 and receives the latch signal SL1. The second end of the transistor M8 receives the clock signal CLK1. The transistor M8 is turned on or turned off according to the clock signal CLK1. In addition, the clock signal CLK1 has the most leading phase, except for the case of the initial pulse, among the clock signals CLK1 to CLK6. The latch L8 is coupled to the third end of the transistor M8. When the transistor M8 is turned on, the latch L8 receives the latch signal SL1 and inverts the latch signal SL1 to generate the input signal SI1 of the data shifter group 110_2. In an embodiment, each of the latches L7 and L8 includes two inverters. The input end of one of the inverters is coupled to the output end of the other inverter, and the output end of one of the inverters is coupled to the input end of the other inverter.

Figure 4:
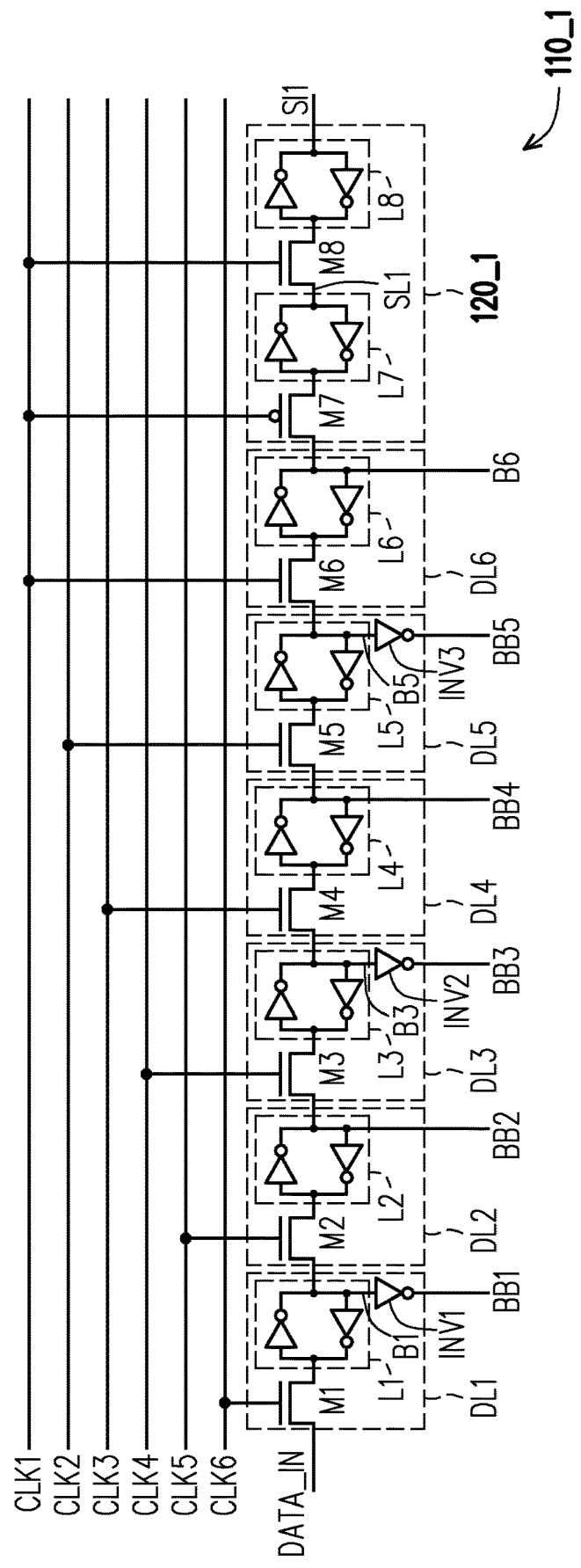
FIG. 4 is a schematic circuit diagram of data shifter groups according to another embodiment of the invention.

The circuit of FIG. 4 is substantially the same as that of FIG. 3. Therefore, details thereof may be referred to FIG. 3 and relevant descriptions. The difference of FIG. 4 from FIG. 3 lies in the odd-numbered stages in the data latches DL1 to DL6. In other words, the data latch DL1 further includes an output inverter INV1, the data latch DL3 further includes an output inverter INV3, and the data latch DL5 further includes an output inverter INV5. In some applications, it is required to output inverted data at odd-numbered stages and output normal data at even-numbered stages, such as the case shown in FIG. 3. However, in some other applications, normal data, instead of inverted data, are required at both the odd-numbered stages and the even-numbered stages. Therefore, the output inverter INV1, the output inverter INV3, and the output inverter INV5 are respectively added to the data latch DL1, the data latch DL3, and the data latch DL5 at the odd-numbered stages among the data latches DL1 to DL6 of FIG. 3, so as to invert the delayed signal B1, the delayed signal B3, and the delayed signal B5. Specifically, the output inverter INV1 receives the delayed signal B1 and inverts the delayed signal B1, so as to generate an inverted delayed signal BB1. The output inverter INV3 receives the delayed signal B3 and inverts the delayed signal B3, so as to generate an inverted delayed signal BB3. The output inverter INV5 receives the delayed signal B5 and inverts the delayed signal B5, so as to generate an inverted delayed signal BB5.

In view of the foregoing, the embodiments of the invention provide a bit data shifter. The bit data shifter includes the data shifter groups cascaded in sequence. The data shifter group is constituted of the data latches cascaded in sequence and the master-slave flip-flop. The data latches cascaded in sequence delay the input signal in sequence to generate the delayed signals. The master-slave flip-flop delays the delayed signal having the most lagged phase among the delayed signals to generate the input signal of the next data shifter group. According to the framework above, the number of master-slave flip-flops can be reduced, so as to effectively reduce the layout area of the bit data shifter.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bit data shifter, receiving an input signal and a plurality of clock signals, and comprising a plurality of data shifter groups cascaded in sequence, wherein each of the data shifter groups cascaded in sequence comprises:

a plurality of data latches cascaded in sequence, configured to delay the input signal in sequence based on the clock signals to generate a plurality of delayed signals; and a master-slave flip-flop, coupled to the data latches cascaded in sequence, and configured to delay one of the delayed signals based on one of the clock signals to generate an input signal of a next data shifter group, wherein a last data latch of the data latches cascaded in sequence and the master-slave flip-flop receives an identical clock signal.

2. The bit data shifter as claimed in claim 1, wherein the master-slave flip-flop is further configured to delay a delayed signal having a most lagged phase among the delayed signals based on a clock signal having a most leading phase, except for a case of an initial pulse, among the clock signals, so as to generate the input signal of the next data shifter group.

3. The bit data shifter as claimed in claim 1, wherein the data shifter groups cascaded in sequence share the clock signals.

4. The bit data shifter as claimed in claim 1, wherein the master-slave flip-flop is a master-slave D-type flip-flop.

5. The bit data shifter as claimed in claim 1, wherein the master-slave flip-flop comprises:

a P-type transistor, wherein a first end of the P-type transistor is coupled to the data latches cascaded in sequence and receives a delayed signal having a most lagged phase among the delayed signals, a second end of the P-type transistor receives a clock signal having a most leading phase, except for a case of an initial pulse, among the clock signals, and the P-type transistor is turned on or turned off according to the clock signal having the most leading phase, except for the case of the initial pulse, among the clock signals;

a first latch, coupled to a third end of the P-type transistor, receiving the delayed signal having the most lagged phase among the delayed signals when the P-type transistor is turned on, and generating a first latch signal;

an N-type transistor, wherein a first end of the N-type transistor is coupled to the first latch and receives the first latch signal, a second end of the N-type transistor receives the clock signal having the most leading phase, except for the case of the initial pulse, among the clock signals, and the N-type transistor is turned on or turned off according to the clock signal having the most leading phase, except for the case of the initial pulse, among the clock signals; and a second latch, coupled to a third end of the N-type transistor, receiving the first latch signal when the N-type transistor is turned on, and generating the input signal of the next data shifter group.

6. The bit data shifter as claimed in claim 5, wherein each of the first latch and the second latch comprises a first inverter and a second inverter, an input end of the first inverter is coupled to an output end of the second inverter, and an output end of the first inverter is coupled to an input end of the second inverter.

7. The bit data shifter as claimed in claim 1, wherein each of the data latches cascaded in sequence comprises:

a control transistor, wherein a first end of the control transistor receives the input signal or one of the delayed signals, a second end of the control transistor receives one of the clock signals, and the control transistor is turned on or turned off according to one of the clock signals; and a latch, coupled to a third end of the control transistor, and receiving the input signal or one of the delayed signals when the control transistor is turned on, so as to generate the delayed signal of the next data latch.

8. The bit data shifter as claimed in claim 7, wherein the latch comprises a first inverter and a second inverter, an input end of the first inverter is coupled to an output end of the second inverter, and an output end of the first inverter is coupled to an input end of the second inverter.

9. The bit data shifter as claimed in claim 7, wherein each of odd-numbered data latches of the data latches cascaded in sequence further comprises:

an output inverter, receiving one of the delayed signals and generating an inverted delayed signal.

10. The bit data shifter as claimed in claim 7, wherein a last data shifter group of the data shifter groups cascaded in sequence comprises the data latches cascaded in sequence but does not comprise the master-slave flip-flop.

* * * * *